(12) United States Patent
Handforth et al.

(10) Patent No.: US 6,621,384 B1
(45) Date of Patent: Sep. 16, 2003

(54) TECHNOLOGY IMPLEMENTATION OF SUSPENDED STRIPLINE WITHIN MULTI-LAYER SUBSTRATE USED TO VARY TIME DELAY AND TO MAXIMIZE THE REACH OF SIGNALS WITH HIGH DATA RATES OR HIGH FREQUENCIES

(75) Inventors: Martin R. Handforth, Kanata (CA); Herman Kwong, Kanata (CA); Richard R. Goulette, Arnprior (CA)

(73) Assignee: Nortel Networks Limited, Quebec (CA)

( * ) Notice: Subject to any disclaimer, the term of this patent is extended or adjusted under 35 U.S.C. 154(b) by 69 days.

(21) Appl. No.: 09/749,435

(22) Filed: Dec. 28, 2000

(51) Int. Cl.[7] .................................................. H01P 3/08
(52) U.S. Cl. .................. 333/238; 333/244; 174/117 AS
(58) Field of Search ............................. 333/1, 238, 243, 333/244, 246; 174/117 AS (56) References Cited

U.S. PATENT DOCUMENTS

| 4,521,755 | A |   | 6/1985 | Carlson et al. .............. 333/244 |
| 4,614,922 | A |   | 9/1986 | Bauman et al. ........... 333/161 |
| 5,105,055 | A | * | 4/1992 | Mooney et al. .......... 333/238 X |
| 5,712,607 | A |   | 1/1998 | Dittmer et al. .............. 333/238 |
| 5,724,012 | A | * | 3/1998 | Teunisse ..................... 333/238 |

* cited by examiner

Primary Examiner—Benny Lee
(74) Attorney, Agent, or Firm—Hunton & Williams LLP (57) ABSTRACT

A technique for providing a multi-layer substrate which is capable of signal transmission at multiple propagation speeds is disclosed. In one embodiment, the technique is realized by constructing a multi-layer substrate by creating air channels in dielectric layers adjacent to a conductor. The air channels may also be filled with an alternative dielectric material. At least three types of multi-layer substrates may be produced through this technique. Furthermore, signal tracks of varying lengths can be provided to accommodate differing delays.

20 Claims, 7 Drawing Sheets

TECHNOLOGY IMPLEMENTATION OF SUSPENDED STRIPLINE WITHIN MULTI-LAYER SUBSTRATE USED TO VARY TIME DELAY AND TO MAXIMIZE THE REACH OF SIGNALS WITH HIGH DATA RATES OR HIGH FREQUENCIES

CROSS REFERENCE TO RELATED APPLICATIONS

This patent application is related to U.S. patent application Ser. No. 09/749,411, filed concurrently herewith and entitled "Suspended Stripline Structures to Reduce Skin Effect and Provide Low Loss Transmission of Signals with High Data Rates or High Frequencies," which is hereby incorporated by reference herein in its entirety.

FIELD OF THE INVENTION

The present invention relates generally to a technique for varying signal transmission delay times and increasing signal reach within a substrate and, more particularly, to a technique for using air channels within a multi-layer substrate for varying signal transmission delay times and increasing signal reach.

BACKGROUND OF THE INVENTION

Figure 12:
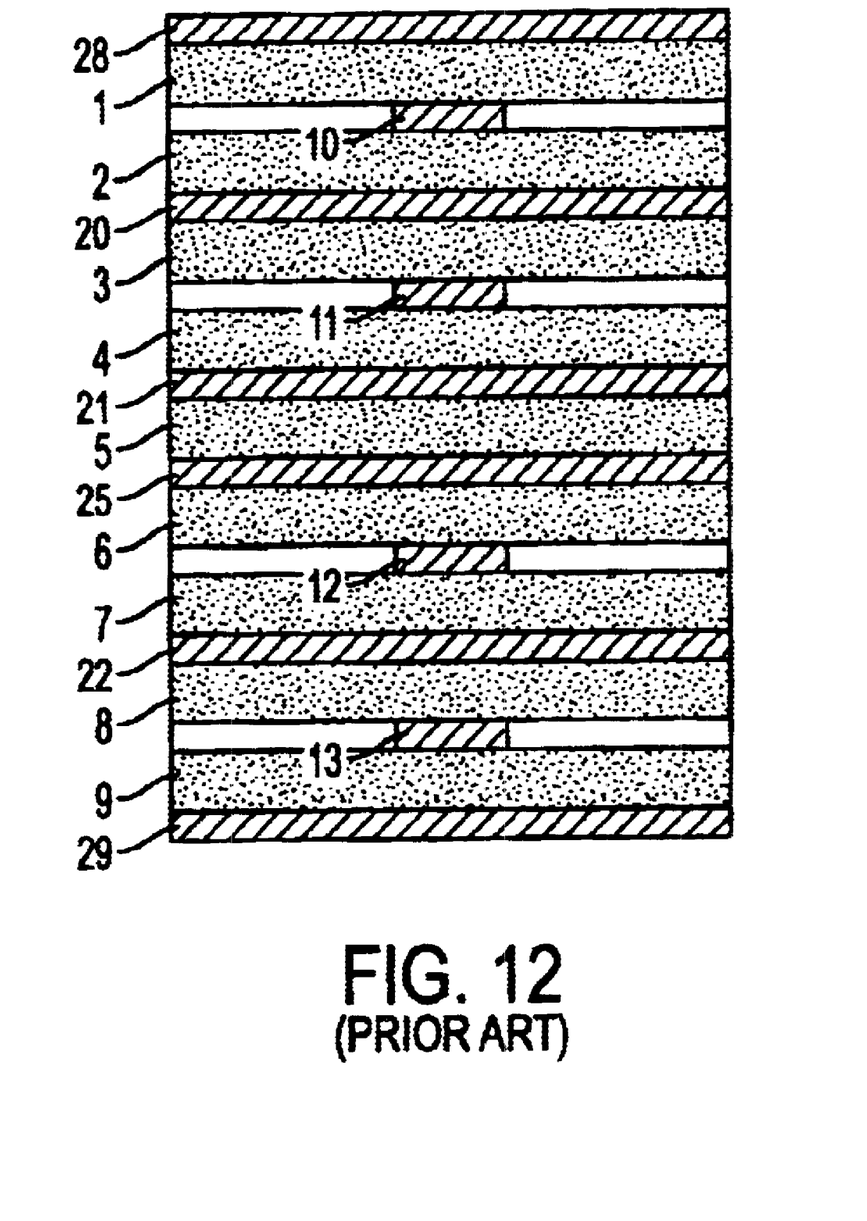
FIG. 12 illustrates a prior art substrate.

The present state of the art is shown in FIG. 12 and is a typical multi-layer substrate. The typical substrate includes multiple dielectric layers 1, 2, 3, 4, 5, 6, 7, 8, and 9. Between the dielectric layers are multiple signal tracks 10, 11, 12 and 13. Metal reference layers, including ground layers 20, 21 and 22 are also formed between the dielectric layers. The metal reference layers additionally include a power layer 25 provided between the dielectric layers 5 and 6, and a primary layer 28 and a secondary layer 29, which form the outermost layers of the substrate.

Signal loss over the distance of the tracks of the signal layers 20–22 frequently occurs with high bit rates or high signal frequencies. Furthermore, the signals with high bit rates or high frequencies often become skewed over the track distance.

When signals with high bit rates or high frequencies are used, such as digital signaling at 10 Gb/s or higher, long signal tracks can result in significant delays.

Signal velocity (v) is calculated as follows:

$$v = c/\sqrt{\in} \quad (2)$$

where c is equal to the speed of light and $\in$ is the dielectric constant. When a typical dielectric having a dielectric constant $\in = 3.9$ is used, signal velocity is reduced to approximately half the speed of light.

With regard to signal reach, the wavelength ($\lambda$) of one bit of information is:

$$\lambda = c/(f\sqrt{\in}) \quad (1)$$

where c is equal to a speed of $3.0 \times 10^{10}$ cm/s, f is equal to a frequency of $10 \times 10^9$ and $\in$ is equal to the dielectric constant of a commonly used substrate material, which is commonly between 3.0 and 4.7. Accordingly, the larger the dielectric constant, the shorter the signal reach.

Suspended substrate striplines have been used to minimize the above-identified problem of losses in striplines. Prior U.S. Pat. Nos. 4,521,755, 4,614,922, and 5,712,607 disclose the use of suspended substrate striplines. In all of the aforementioned patents, which are hereby incorporated by reference herein, the striplines are attached to a substrate which is mounted so as to be surrounded by air on both sides.

In U.S. Pat. No. 4,521,755, the disclosed structure is intended to promote uniform current density and lower losses. In the structure disclosed in U.S. Pat. No. 4,521,755, a channel is formed inside of a conductor. A substrate having striplines is mounted inside the channel.

In U.S. Pat. No. 4,614,922 an upper housing having an upper channel and a lower housing having a lower channel are provided. A center board is positioned between the conductive housings. A transmission strip and a conductive surface are formed on the center board. The structure is intended for use in a microwave circuit.

U.S. Pat. No. 5,712,607 discloses the use of an air-dielectric stripline which includes a dielectric layer sandwiched between two spacer layers. Conductive traces are attached to the dielectric layers. Channels are formed in the spacer layer.

None of the aforementioned patents discloses the use of air channels in multi-layer substrates in order to synchronize signals or more generally, the use of channels for the adjustment of signal transmission times through different signal tracks within the substrate. The previous suspended striplines have employed a mechanical construction, which is too bulky for high density circuit packages.

In view of the foregoing, it would be desirable to provide a technique for synchronizing signals and adjusting signal transmission times within a multi-layer substrate which overcomes the above-described inadequacies and shortcomings. More particularly, it would be desirable to provide a technique for providing air channels for synchronizing signals within a multi-layer substrate in an efficient and cost effective manner.

SUMMARY OF THE INVENTION

According to an aspect of the present invention, a multi-layer substrate is provided. The multi-layer substrate comprises a first dielectric layer having a first dielectric constant and a first stripline disposed adjacent the first dielectric layer. The multi-layer substrate further comprises a second dielectric layer having a channel therein, the channel filled with a substance having a second dielectric constant different from the first dielectric constant and a second stripline adjacent the channel of the second dielectric layer.

According to another aspect of the present invention, a technique for providing a substrate in which signals are transmitted at more than one propagation speed is provided. In one embodiment, the technique is realized by a substrate having striplines with differing signal propagation speeds, the substrate comprising multiple dielectric layers. A first stripline is disposed adjacent a first dielectric layer having a first dielectric constant and has a first signal propagation speed. A second stripline is disposed adjacent a second dielectric layer having an air channel therein, the air channel having a second dielectric constant different from the first dielectric constant. The second stripline has a second signal propagation speed different from the first signal propagation speed.

In accordance with an additional aspect of the invention, a method for forming suspended striplines within a multi-layer substrate is provided. The method comprises the steps of forming a first substrate layer having conductive material on one side, etching the conductive material into a set of striplines, and applying a second substrate layer over the conductive material. The method further comprises forming a channel in one of the substrate layers and attaching a third substrate layer to the substrate layer having the channel.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

Throughout the drawing figures, like elements & features are designated by the same reference numeral and may not be described in detail for all drawing figures.

DETAILED DESCRIPTION OF EXEMPLARY EMBODIMENTS

Figure 1:
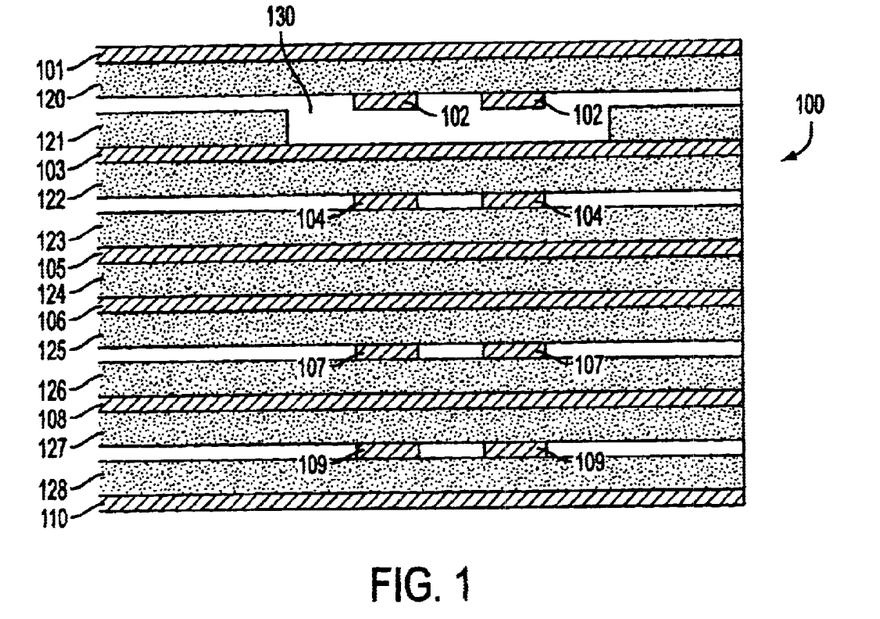
FIG. 1 is a cross-sectional view of a multi-layered substrate in accordance with an embodiment of the invention.

Referring to FIG. 1, there is shown a substrate 100 of a first embodiment of the invention. The substrate 100 includes metal reference layers including a primary layer 101 and a secondary layer 110 forming opposing boundaries. The primary layer 101 and the secondary layer 110 are typically formed from copper, but they may be formed from any other suitable equivalent material. Between the primary and secondary layers 101, 110, multiple dielectric layers 120, 121, 122, 123, 124, 125, 126, 127, and 128 are disposed. Multiple signal tracks 102, 104, 107, and 109 are formed between the dielectric layers. Additional metal reference layers including ground planes 103, 105, and 108 are also formed between adjacent dielectric layers and a power layer 106 is formed between dielectric layers. Finally, an air channel 130 is formed in the dielectric layer 121 through which the signal tracks 102 extend.

The aforementioned dielectric layers 120–128 may be formed from any suitable material and may in fact be formed from differing dielectric materials having different dielectric constants, so as to vary signal propagation speed. In an exemplary embodiment, dielectric layers 125–128 are formed from 10 mils of dielectric material Getek™, which has a dielectric constant of 3.9. The dielectric layer 124 is formed from 5 mils of Getek™. The dielectric layers 121 and 122 are formed from 10 mils of dielectric material Rogers™ RT5880, which has a dielectric constant of 2.2. The dielectric layer 123 is formed from 10 mils of a pressed dielectric which may have a single a dielectric constant or may be a laminated dielectric slab having multiple dielectric constants, for example 4.0/8.0/16. If the latter approach is chosen, different dielectric materials can be implemented to create differing delay times in one dielectric layer.

The signal tracks 102, 104, 107, and 109, ground planes 103, 105, and 108, power layer 106, primary layer 101, and secondary layer 110 are preferably formed of copper. In an embodiment of the invention, the signal tracks 102, 103, 107, and 109, and the primary 101, secondary 110, and ground planes 103 and 108 are formed from 0.65 mils of copper. The power layer 106 and ground layer 105 are formed from 1.3 mils of copper.

The air channel 130 is preferably laser ablated into the dielectric layer 121. The air channel 130 may be formed by other methods including but not limited to the manufacturing of trenches using microvia technology, mechanical pressing, or mechanical milling. The dielectric constant of the air channel is 1.0 and the thickness dimension of the air channel preferably corresponds to the thickness of the dielectric layer 121, which is 10 mils in the provided embodiment.

In one possible configuration, the signal tracks 102 are bordered on one side by the dielectric layer 120, which may have a dielectric constant of approximately 2.2 and on an opposite side by the air channel 130, which has a dielectric constant of 1.0. Regardless of the material chosen for the dielectric layers, the air channel 130 will always have a dielectric constant of approximately 1.0, thereby enhancing signal propagation speed.

Figure 2:
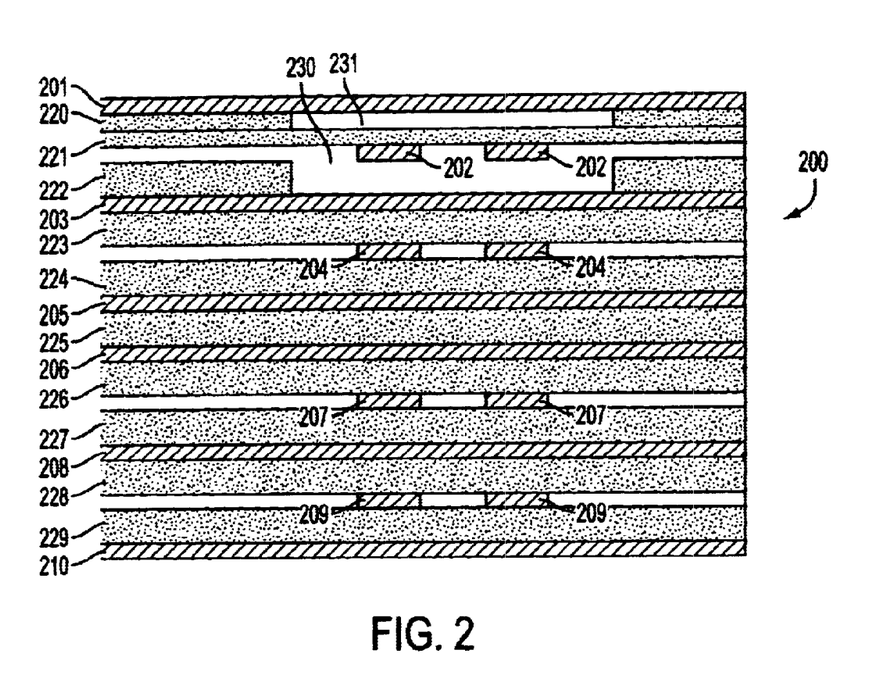
FIG. 2 is a cross-sectional view of a multi-layered substrate in accordance with an alternative embodiment of the invention.

FIG. 2 illustrates a second embodiment of the substrate of the invention. As in the first embodiment, the substrate 200 includes multiple dielectric layers and signal tracks. A primary layer 201 and a secondary layer 210 form opposite peripheries of the substrate. Dielectric layers 220, 221, 222, 223, 224, 225, 226, 227, 228, and 229 are interspersed throughout the substrate. Ground planes 203, 205, and 208 are formed between dielectric layers. A power layer 206 is also provided between the dielectric layers 225 and 226.

The aforementioned dielectric layers 220–229 may be formed from any suitable material and may in fact be formed from differing dielectric materials having different dielectric constants, so as to vary signal propagation speed. In an exemplary embodiment, the dielectric layers 225–229 are formed from Getek™, which as set forth above, has a dielectric constant of 3.9. The dielectric layers 226–229 may have a thickness of approximately 10 mils and the dielectric layer 225 may have a thickness of approximately 5 mils. The dielectric layer 221 can be formed from approximately 5 mils of Rogers™ RT5880 having a dielectric constant of approximately 2.2. The dielectric layer 223 can be formed from approximately 5 mils of pressed dielectric having a dielectric constant of 4.0/8.0/16.0 and 5 mils of Rogers™ RT5880. The dielectric layer 224 may be formed from approximately 10 mils of the aforementioned pressed dielectric.

The signal tracks 202, 204, 207, and 209 are preferably formed of copper having a thickness of approximately 0.65 mils. The primary layer 201, secondary layer 210, and two ground plane layers 203 and 208 are formed from copper having a thickness of approximately 0.65 mils. In the illustrated embodiment, the power layer 206 and ground plane layer 205 are formed of approximately 1.3 mils of copper.

The air channel 230 is preferably laser ablated into the dielectric layer 222 and the air channel 231 is preferably laser ablated into the dielectric layer 220. The channels 230 and 231 create a suspended substrate 221 because the substrate 221 is bordered on two sides by the air channels 230 and 231.

Figure 3:
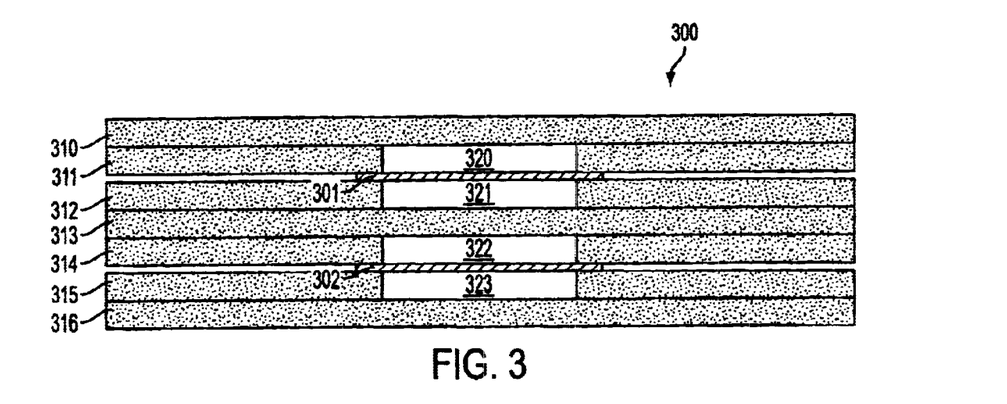
FIG. 3 is a cross-sectional view of a multi-layered substrate in accordance with another alternative embodiment of the invention.

A third embodiment of a substrate 300 of the invention is illustrated in FIG. 3. Dielectric layers 310, 311, 312, 313, 314, 315, and 316 and air channels 320, 321, 323, and 323 surround signal tracks 301 and 302. This structure represents merely a portion of a multi-layered substrate and would likely be incorporated into a complete substrate structure having the primary, secondary, ground, and power layers as shown in FIGS. 1 and 2.

The signal tracks 301 and 302 are surrounded by the air channels 320–323, thereby creating suspended striplines. To form the air channel 320, the dielectric layer 311 is preferably laser ablated. The dielectric layer 312 is preferably laser ablated to form the air channel 321. The dielectric layer 314 is preferably laser ablated to form the air channel 322 and the dielectric layer 315 is preferably laser ablated to form the air channel 323.

Figure 3A:
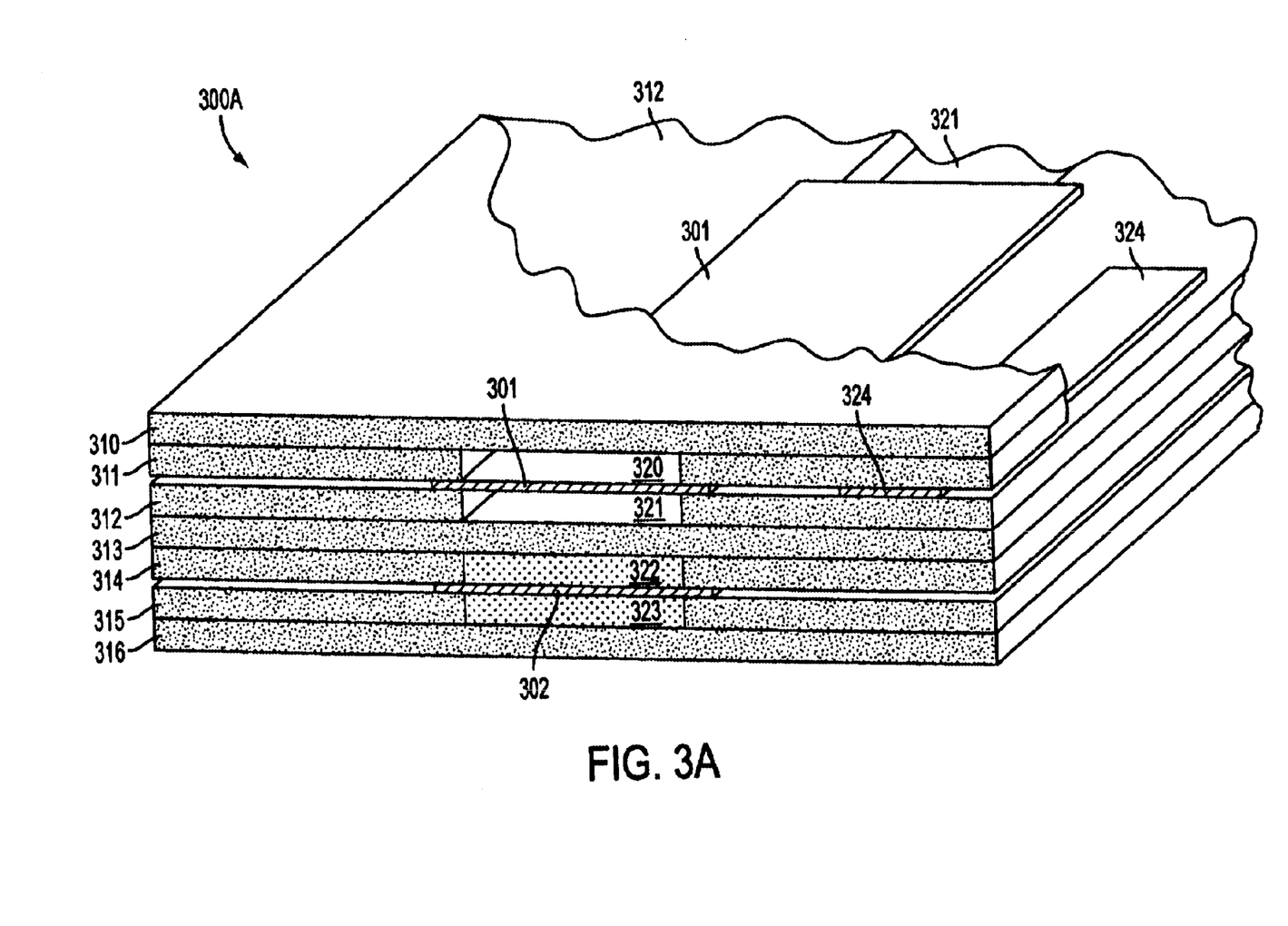
FIG. 3A is a perspective cross-sectional view of the multi-layered substrate of FIG. 3 having an additional signal track in accordance with another alternative embodiment of the invention.

In any of the three above-described embodiments, the signal tracks may be formed of different lengths, and the air channels may be filled with alternative dielectric materials. For instance, referring to FIG. 3A, in substrate 300A signal track 301 is shown having a length that is longer than the length of signal track 324, and channels 322 and 323 are shown filled with an alternative dielectric material (e.g., a non-air dielectric material). In order to synchronize a signal which sees a dielectric constant of 1.0 with a signal that sees a dielectric constant of 3.0, a signal track (e.g., signal track 301) adjacent an air channel with a 1.0 dielectric constant may be shorter than a signal track (e.g., signal track 324) adjacent a dielectric having a dielectric constant of 3.0. Furthermore, it may be desirable for various applications to have signals within the substrate reach their destinations at different times.

Figure 4:
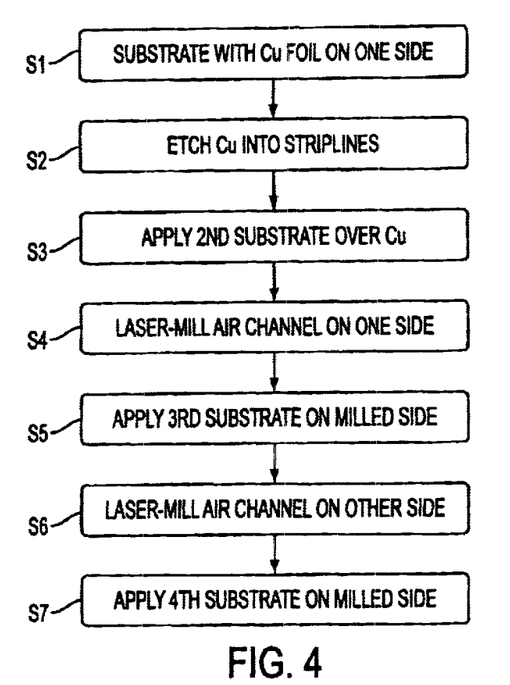
FIG. 4 is a flow chart illustrating a method of the invention.

FIG. 4 illustrates a method by which the three aforementioned substrate embodiments can be constructed. FIGS. 5–11 show each method step individually.

Figure 5:
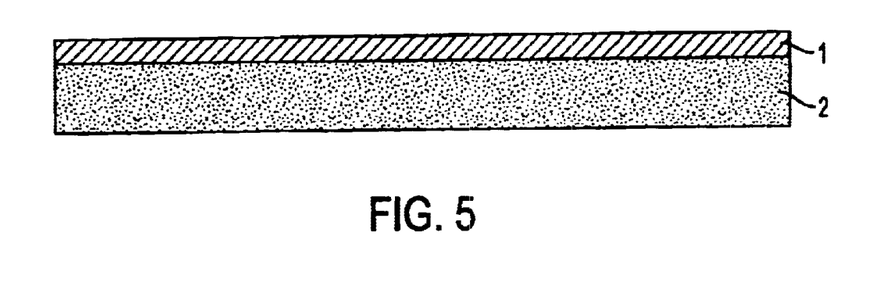
FIG. 5 illustrates a cross-section of an embodiment of the invention after a first method step.

In step S1 of FIG. 4, a substrate layer having copper foil on one side is produced. Step S1 is shown in FIG. 5 in which a substrate 2 is covered with a copper foil 1.

Figure 6:
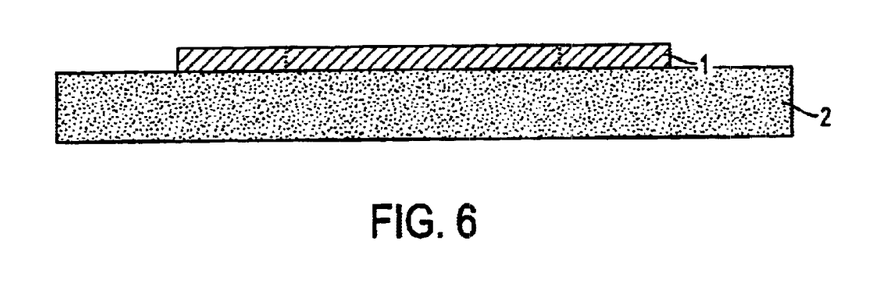
FIG. 6 illustrates a cross-section of an embodiment of the invention in a further stage of construction.

In step S2 of FIG. 4, the copper foil is etched into striplines. This step is shown in FIG. 6 in which the substrate 2 is covered with etched copper foil 1.

Figure 7:
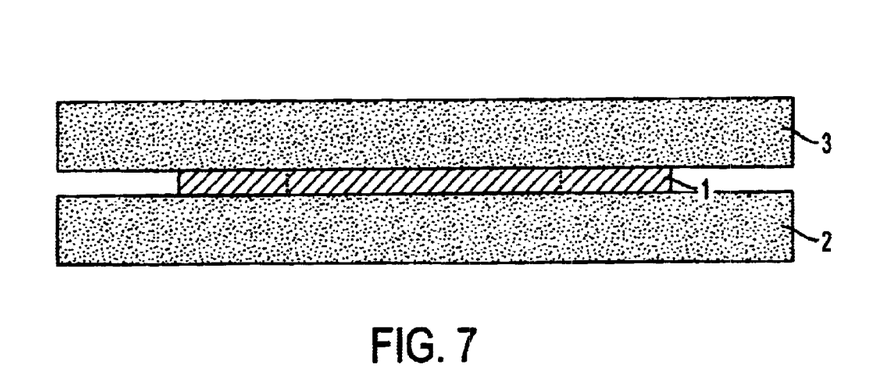
FIG. 7 illustrates a cross-section of an embodiment of the invention in yet a further stage of construction.

In step S3 of FIG. 4, a second substrate is applied over the copper foil. This step is shown in FIG. 7 in which a substrate 3 is placed upon the etched copper foil 1.

Figure 8:
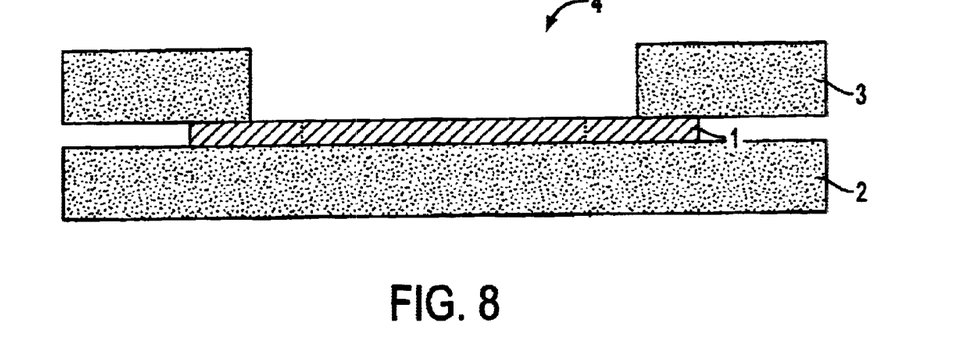
FIG. 8 illustrates a cross-section of an embodiment of the invention in yet a further stage of construction.

In step S4 of FIG. 4, a channel is laser ablated into one of the substrates. Step S4 is shown in FIG. 8 in which a channel 4 is created in the substrate 3, thereby exposing the copper track 1.

Figure 9:
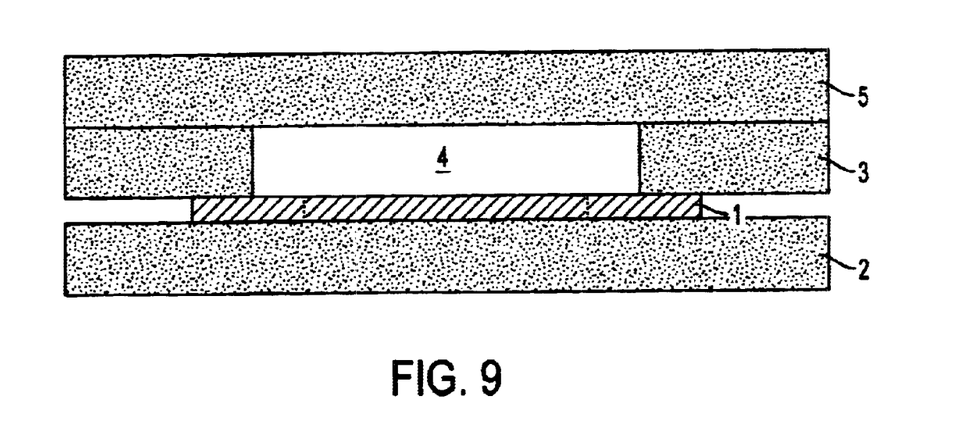
FIG. 9 is a cross-sectional view of an embodiment of the invention in a further stage of construction.

In step S5 of FIG. 4, a third substrate is applied to the substrate having the laser ablated channel. Step S5 is shown in FIG. 9 in which a substrate 5 is placed over the substrate 3.

Figure 10:
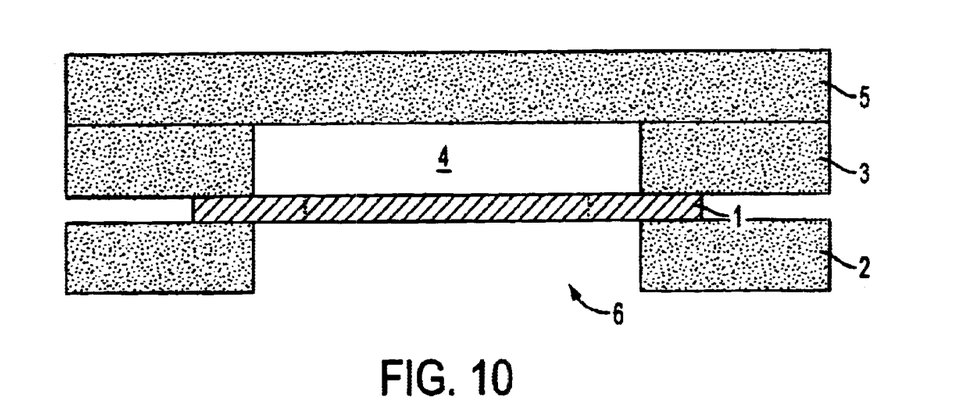
FIG. 10 is a cross-sectional view of an embodiment of the invention in a further stage of construction.

In step S6, a channel is laser ablated into the substrate on the opposite side. Step S6 is shown in FIG. 10 in which a channel 6 is laser ablated into the substrate layer 2, thereby exposing the copper track 1.

In step S7, a fourth substrate is applied on the side milled in step S6. This step is shown in FIG. 11 in which a substrate 7 is placed adjacent the substrate 2 overlaying the air channel 6.

Figure 11:
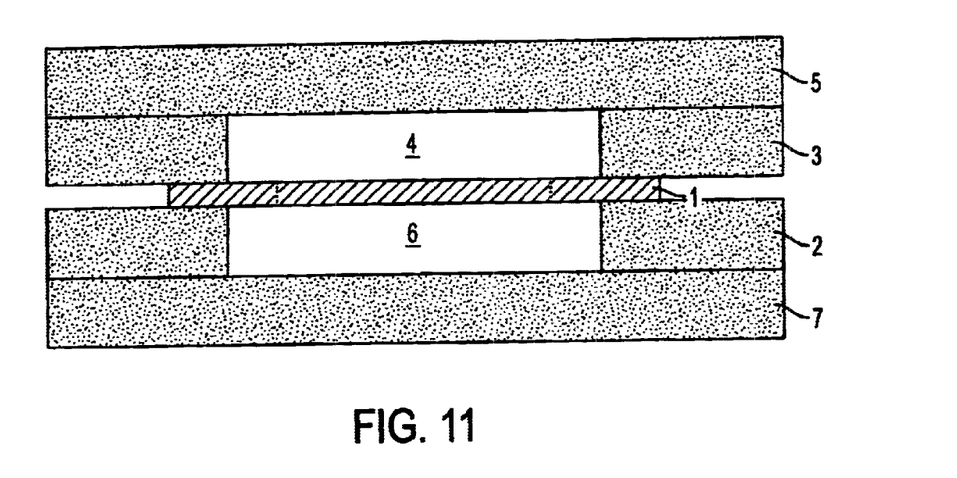
FIG. 11 is a cross sectional view of an embodiment of the invention in its final stage of construction.

The final structure shown in FIG. 11 is a suspended stripline, which corresponds to the embodiment of the invention as shown in FIG. 3. Similar procedures can be used to produce the non-suspended stripline using air channels of FIG. 1 and the suspended stripline substrate of FIG. 2.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A multi-layer substrate comprising:
    a stripline having a first surface and an opposing second surface;
    a first dielectric layer for supporting a first portion of the first surface of the stripline, the first dielectric layer having a first channel formed therein for exposing a second portion of the first surface of the stripline;
    a second dielectric layer for supporting a first portion of the second surface of the stripline, the second dielectric layer having a second channel formed therein for exposing a second portion of the second surface of the stripline; and
    a third dielectric layer disposed adjacent the first dielectric layer so as to enclose the first channel.

2. The multi-layer substrate of claim 1, further comprising:
    a fourth dielectric layer disposed adjacent the second dielectric layer so as to enclose the second channel.

3. The multi-layer substrate of claim 1, wherein the first dielectric layer has a first dielectric constant, and wherein the first channel is filled with a first substance having a dielectric constant that is different than the first dielectric constant.

4. The multi-layer substrate of claim 3, wherein the first substance is air.

5. The multi-layer substrate of claim 3, wherein the second dielectric layer has a second dielectric constant, and wherein the second channel is filled with a second substance having a dielectric constant that is different than the second dielectric constant.

6. The multi-layer substrate of claim 5, wherein the second substance is air.

7. The multi-layer substrate of claim 1, wherein the first dielectric layer and the second dielectric layer have similar dielectric constants.

8. The multi-layer substrate of claim 1, wherein the first dielectric layer and the second dielectric layer have different dielectric constants.

9. The multi-layer substrate of claim 1, wherein the stripline is a first stripline having a first length, further comprising:

a second stripline having a second length formed within the multi-layer substrate, the second length being different from the first length so as to synchronize signals propagating along the first stripline and the second stripline.

10. A multi-layer substrate having a plurality of dielectric layers comprising:

a first stripline having a first length formed between a first of the plurality of dielectric layers and a second of the plurality of dielectric layers, the second dielectric layer having a channel formed therein for exposing at least a portion of the first stripline; and a second stripline having a second length formed between a third of the plurality of dielectric layers and a fourth of the plurality of dielectric layers;

wherein the first length is different from the second length so as to synchronize signals propagating along the first stripline and the second stripline.

11. The multi-layer substrate of claim 10, wherein the first dielectric layer and the second dielectric layer provide the first stripline with a first associated dielectric constant, wherein the third dielectric layer and the fourth dielectric layer provide the second stripline with a second associated dielectric constant, wherein the channel formed in the second dielectric layer causes the first associated dielectric constant to be smaller than the second associated dielectric constant.

12. A method for forming a suspended stripline within a multi-layer substrate, the method comprising the steps of:

providing a first dielectric layer having conductive material formed on one side;

shaping the conductive material into a stripline;

applying a second dielectric layer over the conductive material;

forming a first channel in the first dielectric layer so as to expose a first portion of the stripline and support a second portion of the stripline;

forming a second channel in the second dielectric layer so as to expose a third portion of the stripline and support a fourth portion of the stripline; and applying a third dielectric layer over the first dielectric layer so as to enclose the first channel.

13. The method of claim 12, wherein the first dielectric layer has a first dielectric constant, further comprising the step of:

filling the first channel with a first substance having a dielectric constant that is different than the first dielectric constant.

14. The method of claim 13, wherein the first substance is air.

15. The method of claim 12, wherein the second dielectric layer has a second dielectric constant, further comprising the step of:

filling the second channel with a second substance having a dielectric constant that is different than the second dielectric constant.

16. The method of claim 15, wherein the second substance is air.

17. The method of claim 12, wherein the first dielectric layer and the second dielectric layer have similar dielectric constants.

18. The method of claim 12, wherein the first dielectric layer and the second dielectric layer have different dielectric constants.

19. The method of claim 12, wherein the stripline is a first stripline having a first length, further comprising:

forming a second stripline having a second length within the multi-layer substrate, the second length being different from the first length so as to synchronize signals propagating along the first stripline and the second stripline.

20. The method of claim 12, further comprising the step of:

applying a fourth dielectric layer over the second dielectric layer so as to enclose the second channel.

* * * * *